(12) United States Patent
Ayotte et al.

(10) Patent No.: US 9,704,830 B1
(45) Date of Patent: Jul. 11, 2017

(54) SEMICONDUCTOR STRUCTURE AND METHOD OF MAKING

(71) Applicant: International Business Machines Corporation, Armonk, NY (US)

(72) Inventors: Stephen P. Ayotte, Bristol, VT (US); Glen E. Richard, Burlington, VT (US); Timothy M. Sullivan, Essex, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/994,702

(22) Filed: Jan. 13, 2016

(51) Int. Cl.
*H01L 23/48* (2006.01)
*H01L 23/02* (2006.01)
*H01L 25/065* (2006.01)
*H01L 21/78* (2006.01)
*H01L 23/00* (2006.01)
*H01L 21/768* (2006.01)
*H01L 23/528* (2006.01)
*H01L 23/532* (2006.01)
*H01L 25/00* (2006.01)

(52) U.S. Cl.
CPC .... *H01L 25/0657* (2013.01); *H01L 21/76877* (2013.01); *H01L 21/76898* (2013.01); *H01L 21/78* (2013.01); *H01L 23/481* (2013.01); *H01L 23/528* (2013.01); *H01L 23/53214* (2013.01); *H01L 23/53228* (2013.01); *H01L 23/53257* (2013.01); *H01L 23/562* (2013.01); *H01L 25/50* (2013.01); *H01L 2225/06544* (2013.01); *H01L 2225/06551* (2013.01)

(58) Field of Classification Search
CPC ... H01L 25/0657; H01L 25/50; H01L 23/481; H01L 23/528; H01L 23/562; H01L 23/523214; H01L 23/53228; H01L 23/53257; H01L 21/76877; H01L 21/76898; H01L 21/78
USPC ............... 257/315, 621, 774, 786, E21.495, 257/E23.141; 438/618, 666
See application file for complete search history.

(56) References Cited

U.S. PATENT DOCUMENTS

| 5,126,286 | A | | 6/1992 | Chance |
| 5,530,280 | A | | 6/1996 | White |
| 5,699,234 | A | * | 12/1997 | Saia .................... H01L 23/5389 257/686 |

(Continued)

FOREIGN PATENT DOCUMENTS

JP          201599245 A     5/2015

*Primary Examiner* — Dao H Nguyen
(74) *Attorney, Agent, or Firm* — Cantor Colburn LLP; Bryan Bortnick (57) ABSTRACT

A semiconductor structure in the form of a die comprises a silicon-containing core having a first surface, an opposite second surface and a peripheral edge surface. A circuit structure on the first surface is circumscribed by a peripheral crackstop structure which stops short of the second surface, thereby leaving an accessible portion of the peripheral edge surface free of the crackstop structure. One or more angular or orthogonal edge connector through-silicon conductive vias ("edge connector TSVs") connect the circuit structure to the accessible portion of the peripheral edge surface without penetrating the crackstop structure. A method of making the structure includes forming the edge connector TSVs in the silicon wafer from which the semiconductor structures, i.e., dies, are cut.

16 Claims, 5 Drawing Sheets

(56) References Cited

U.S. PATENT DOCUMENTS

| | | | | |
|---|---|---|---|---|
| 6,037,044 | A * | 3/2000 | Giri | H01L 23/5383 |
| | | | | 174/255 |
| 6,768,189 | B1 * | 7/2004 | Anderson | H01L 23/3114 |
| | | | | 174/262 |
| 6,919,508 | B2 | 7/2005 | Forcier | |
| 7,078,803 | B2 | 7/2006 | Tilton et al. | |
| 7,148,554 | B2 * | 12/2006 | Nah | H05K 1/0206 |
| | | | | 257/528 |
| 7,285,865 | B2 * | 10/2007 | Kwon | H01L 24/11 |
| | | | | 257/723 |
| 7,371,076 | B2 | 5/2008 | Yen | |
| 7,420,262 | B2 | 9/2008 | Bauer et al. | |
| 7,635,643 | B2 | 12/2009 | Daubenspeck et al. | |
| 7,804,175 | B2 | 9/2010 | Kamins et al. | |
| 8,097,943 | B2 | 1/2012 | Badakere et al. | |
| 8,138,617 | B2 * | 3/2012 | Poo | H01L 21/78 |
| | | | | 257/665 |
| 8,299,592 | B2 * | 10/2012 | Suh | H01L 23/481 |
| | | | | 257/276 |
| 8,871,570 | B2 | 10/2014 | Levy et al. | |
| 8,961,193 | B2 | 2/2015 | Chawla et al. | |
| 2004/0207049 | A1 | 10/2004 | Bauer et al. | |
| 2008/0179756 | A1 | 7/2008 | Kamins et al. | |
| 2014/0021616 | A1 | 1/2014 | Anzola et al. | |
| 2014/0024146 | A1 | 1/2014 | Anzola et al. | |
| 2015/0145028 | A1 | 5/2015 | Laven et al. | |
| 2015/0147856 | A1 | 5/2015 | Irsigler et al. | |

\* cited by examiner

SEMICONDUCTOR STRUCTURE AND METHOD OF MAKING

BACKGROUND

The present invention relates to a semiconductor structure comprising a silicon-containing substrate having a peripheral edge surface and a circuit structure circumscribed by a crackstop structure. Through-silicon conductive vias are configured to connect the circuit structure to the peripheral edge surface without penetrating the crackstop structure.

Three-dimensional (3D) stacking of integrated circuits have improved circuit performance. More specifically, advancements in the area of semiconductor fabrication have enabled the manufacturing of integrated circuits that have a high density of electronic components.

Fabrication of 3D integrated circuits includes at least two silicon die stacked vertically. Vertically stacked die can reduce interconnect wiring length and increase semiconductor device density. Deep through-substrate/through-silicon vias (TSVs) may be formed to provide interconnections and electrical connectivity between the electronic components of the 3D integrated circuits. Such TSVs may have high aspect ratios, where the via height is large with respect to the via width, to save valuable area in an integrated circuit design. Therefore, semiconductor device density can be increased and total length of interconnect wiring may be decreased by incorporating TSVs in 3D integrated circuits.

SUMMARY

In accordance with one aspect of the present invention there is provided a semiconductor structure comprising the following components. A silicon-containing substrate has a first surface on which is disposed a circuit structure, an opposite second surface and a peripheral edge surface. A peripheral crackstop structure circumscribes the circuit structure and stops short of the second surface, to thereby leave an accessible portion of the peripheral edge surface free of the crackstop structure. One or more edge connector through-silicon conductive vias ("edge connector TSVs") connect the circuit structure to the accessible portion of the peripheral edge surface without penetrating the crackstop structure.

In accordance with another aspect of the present invention there is provided a semiconductor structure comprising the following components. A silicon-containing substrate has a first surface on which is disposed a circuit structure circumscribed by a peripheral crackstop structure, an opposite second surface and a peripheral edge surface. The peripheral crackstop structure stops short of the second surface to thereby leave an accessible portion of the peripheral edge surface free of the crackstop structure. One or more edge connector through-silicon conductive vias ("edge connector TSVs") connect the circuit structure to the accessible portion of the peripheral edge surface without penetrating the crackstop structure. The one or more edge connector TSVs may be angular edge connector TSVs characterized by having at least a segment of the angular edge connector TSVs extending through the substrate at an acute angle relative to the first surface and extending to the accessible portion of the peripheral edge surface. Alternatively, or in addition, the edge connector TSVs may be orthogonal edge connector TSVs characterized by having at least a first leg and a second leg, the first leg extending substantially perpendicularly to the first surface through the substrate to the second leg, and the second leg extending along the second surface to the accessible portion of the peripheral edge surface.

A method aspect of the present invention provides for making a plurality of semiconductor structures, the method comprising the following steps. Providing a silicon wafer having a top surface on which are a plurality of mounting areas adapted to receive circuit structures, an opposite bottom surface, and a plurality of peripheral crackstop structures extending about associated ones of the mounting areas. A plurality of conductive through-silicon vias ("TSVs") are formed in the wafer to extend from respective ones of the mounting areas. The wafer is diced along dicing pathways to form a plurality of dies having respective opposite first and second surfaces and peripheral edge surfaces defining a core of the die. The improvement to the method comprises that the crackstop structure extends below the top surface of the wafer and stops short of the bottom surface of the wafer whereby the peripheral edge surfaces of the dies cut from the wafer comprise accessible portions through which the core is accessible without penetrating the crackstop structure. Further, at least some of the TSVs are edge connector TSVs configured to extend from respective ones of the mounting areas to locations on the dicing pathways which are free of the crackstop structures, so that when the dies are cut from the wafer, the edge connector TSVs terminate at the accessible portions of the peripheral edge surfaces of the dies, without penetrating the crackstop structure.

DETAILED DESCRIPTION

In order to form an electrical connection between the components of two die, stacked one on top of the other, a TSV may extend through the entire thickness of a single die. More specifically, a TSV may extend through multiple interconnect levels and through a semiconductor substrate in which semiconductor devices may be formed. The interconnect levels may generally be located above the substrate, and may include multiple connections to and between the devices formed in the substrate.

Due to shrinking dimensions for the devices fabricated on an integrated circuit, fabrication processes may utilize different dielectric materials, for example, low or ultra-low-k dielectric materials. Utilization of such dielectric materials may affect reliability due to the material's mechanical properties (e.g., low modulus, low strength, poor adhesion) as compared to other dielectrics, such as silicon dioxide. Dicing of stacked wafers to form 3D TSVs may trigger cracking at the pre-metal dielectric and silicon substrate interface. A crack that begins at an edge may propagate down through the body of the semiconductor device, and may damage underlying conductive lines or enter the active region, which may result in a defect or failure of the device such as an open or shorted connection. Accordingly, crackstop structures are formed within devices as barriers to stop cracks from propagating from peripheral edges and damaging the devices.

However, semiconductor devices which include a peripheral crackstop structure extending about the circuit structure of the device are limited with respect to portions of the device to which a conductive through-silicon via ("TSV") may extend. In order to maintain integrity of the crackstop structure, the TSVs generally follow paths which do not penetrate the crackstop structure. The crackstop structure may extend around the entire periphery of a die, including from one major surface of the die to the other, that is, from top to bottom of the die. For this reason, TSVs may be directed between the top and bottom major surfaces of the die, taking care to avoid penetrating the peripheral edge surfaces of the die. Otherwise, the crackstop structure may be compromised by the TSVs.

Given the ever increasingly crowded structures and limited space available for making connections, the lack of opportunity to make connections through the peripheral edge of the die may be challenging. The structures and method disclosed herein enable directing at least some TSVs from a major surface of the die through a monolithic silicon substrate to and through its peripheral edge surfaces, and not merely upon a major surface to an edge of the peripheral edge surfaces. The edge connector TSVs penetrate an accessible portion of the peripheral edge surfaces without encountering, penetrating or otherwise adversely affecting the structural integrity of the crackstop structure.

Figure 1:
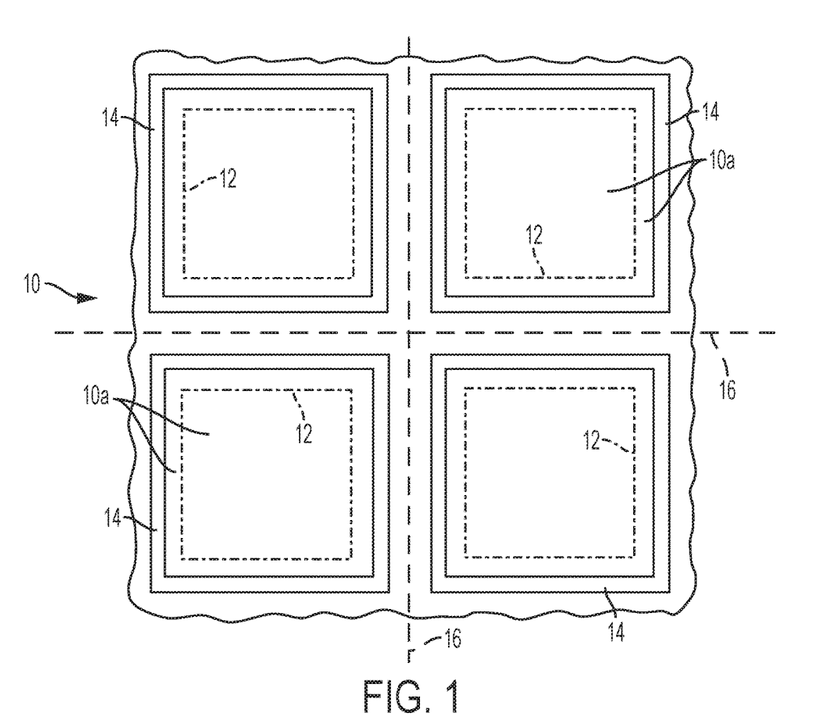
FIG. 1 is a schematic partial plan view of one embodiment of a silicon wafer having thereon a plurality of mounting areas enclosed by crackstop structures and adapted to receive circuit structures.

FIG. 1 shows a portion of a silicon wafer 10 whose top surface 10a has a plurality of mounting areas 12 indicated in dot-dash lines and within which circuit structures (not shown in FIG. 1) may be mounted. As used herein, the term "circuit structures" includes passive and active components which may be connected to the TSVs. Crackstop structures 14 are configured to provide a peripheral crackstop circumscribing respective ones of the mounting areas 12. Dicing pathways 16 are shown by bold dash lines and indicate the paths which a dicing saw will follow to later cut wafer 10 into a plurality of dies such as dies 18 (FIG. 1A and FIG. 1B).

Figure 1A:
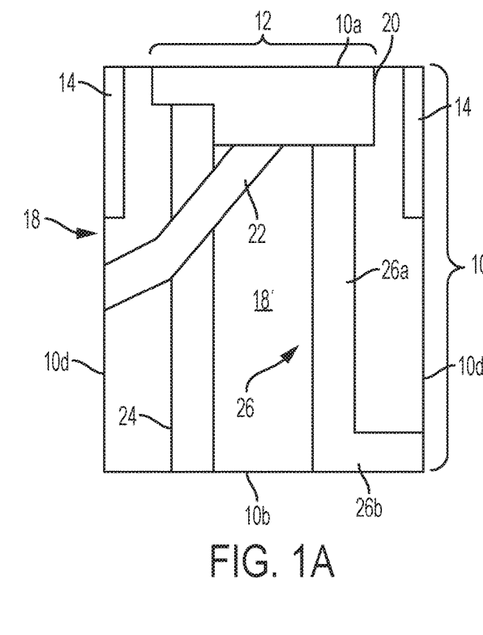
FIG. 1A is a cross-sectional view in elevation of a semiconductor structure cut from the wafer of FIG. 1 after conductive through-silicon vias were formed in the wafer in accordance with a first embodiment of the present invention.

FIG. 1A shows the silicon core 18' of die 18 bounded by first surface 10a, opposite second surface 10b and peripheral edge surfaces 10c thereof. Peripheral edge surfaces 10c of die 18 are defined by crackstop structure 14 and an accessible portion 10d of peripheral edge surfaces 10c. As best seen in FIG. 1A, crackstop structure 14 stops short of the second surface 10b of die 18, thereby providing the accessible portion 10d of the peripheral edge surfaces 10c. The term "accessible portion" is used because that portion of the peripheral edge surfaces 10c is accessible to TSVs extending through core 18' without encountering or penetrating crackstop structure 14.

Figure 1B:
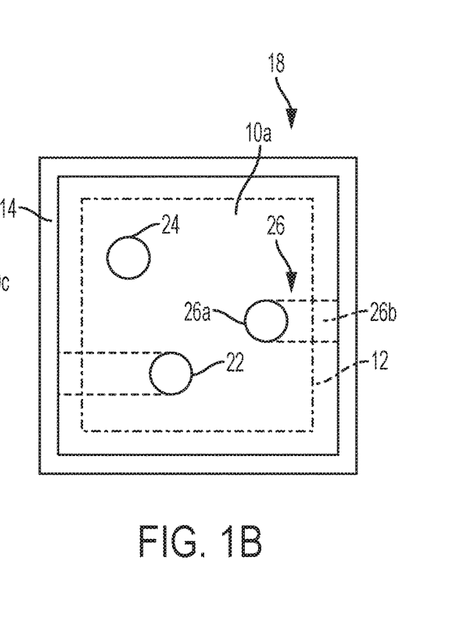
FIG. 1B is a top plan view, reduced in size relative to FIG. 1A, of the die of FIG. 1A.

FIGS. 1A and 1B show a number of TSVs formed within the silicon core 18' of die 18. The TSVs may be formed by any suitable method. The TSVs may include one or more layers and/or liners. The TSV may include, for example, a dielectric layer, a liner arranged on the dielectric layer, and a metal to fill the trench and form the TSV. The liner may improve adhesion of the metal. The liner may include a metallic compound. The liner may include, for example, tantalum nitride (TaN), followed by an additional layer including tantalum (Ta). Other barrier liners may include cobalt (Co), or ruthenium (Ru) either alone or in combination with any other suitable liner. The liner material may be deposited by a chemical vapor deposition process (CVD), atomic layer deposition (ALD), or other suitable process. The metal may include, for example, copper (Cu), aluminum (Al), or tungsten (W). The metal may be formed using a filling technique such as electroplating, electroless plating, CVD, PVD, or a combination thereof.

Angular edge connector TSV 22 extends from mounting area 12 and intersects accessible portion 10d of peripheral edge surface 10c without encountering or penetrating crackstop structure 14. A bottom connector TSV 24 extends from mounting area 12 on first surface 10a to second surface 10b and is substantially perpendicular to both first surface 10a and second surface 10b. An orthogonal edge connector TSV 26 comprises a first leg 26a which extends substantially perpendicularly to both first surface 10a and second surface 10b. First leg 26a is connected to a second leg 26b which extends along second surface 10b to an accessible portion 10d of the die 18.

All the through-silicon vias 22, 24, 26 may be formed by conventional techniques including thermal treatment and the application of an electric field in order to attain the angular disposition of angular edge connector TSV 22. Circuit structure 20 is connected by angular edge connector TSV 22 and by orthogonal edge connector TSV 26 to penetrate the accessible portion 10d of die 18.

Figure 2:
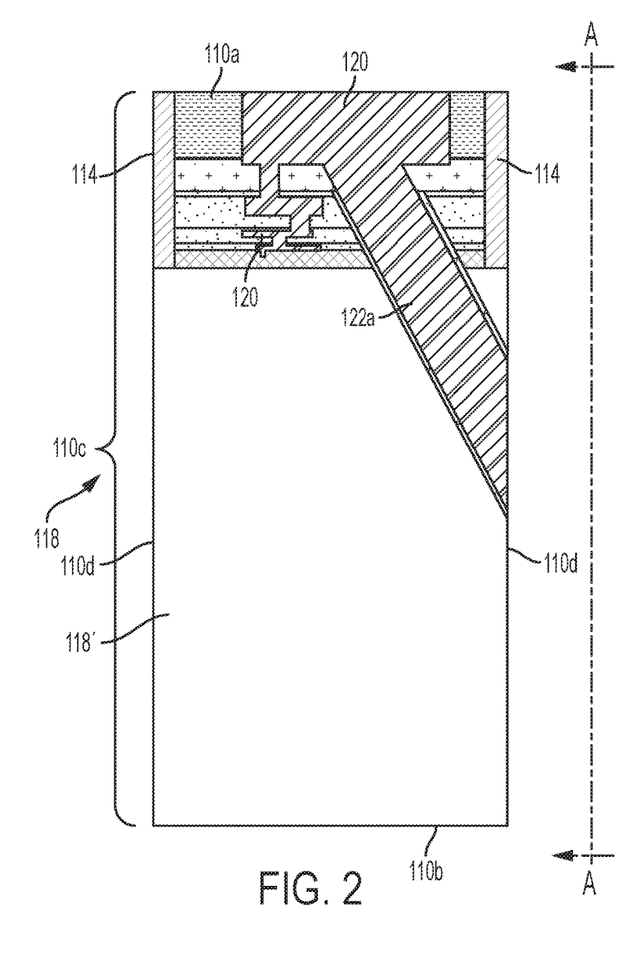
FIG. 2 is a schematic cross-sectional view in elevation of a semiconductor structure in accordance with another embodiment of the present invention.
Figure 2A:
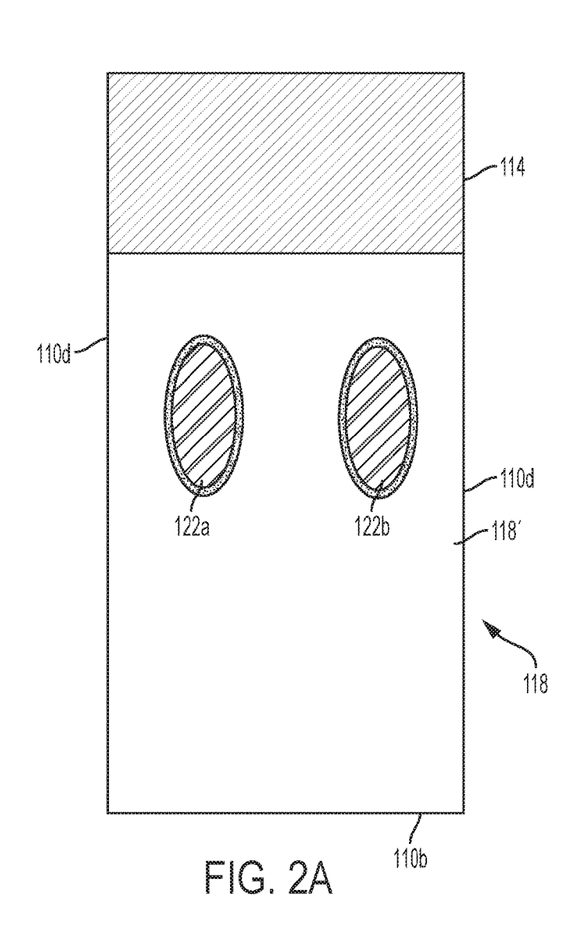
FIG. 2A is a view in elevation taken along line A-A of FIG. 2.
Figure 3:
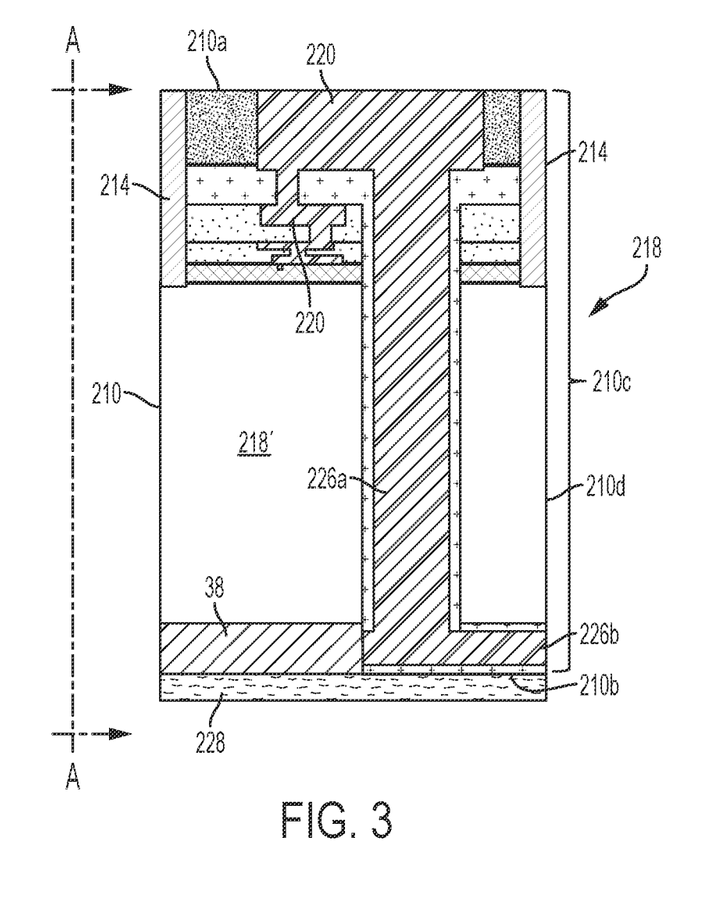
FIG. 3 is a schematic cross-sectional view corresponding to that of FIG. 2 of a semiconductor structure in accordance with another embodiment of the present invention.
Figure 3A:
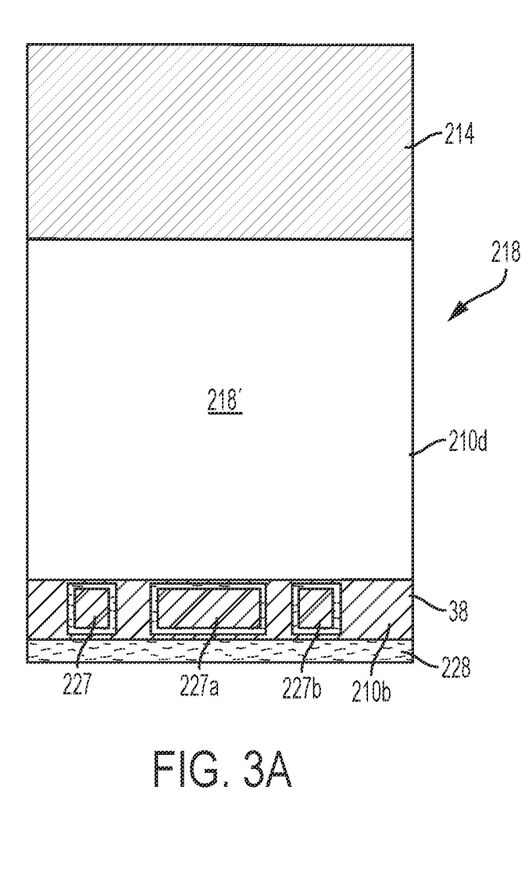
FIG. 3A is a view in elevation taken along line A-A of FIG. 3.

In the description of FIGS. 2 through 3A, parts comparable to the parts illustrated in FIGS. 1 through 1B are identically numbered except for the addition of an initial numeral 1 (FIGS. 2 and 2A) or an initial numeral 2 (FIGS. 3 and 3A).

Referring to FIGS. 2 and 2A, die 118, in a construction similar to that of die 18 of FIGS. 1A and 1B, has a crackstop structure 114, a first surface 110a, a second surface 110, peripheral edge surface 110c defined by crackstop surface 114 and accessible portion 110d of peripheral edge surface 110c. A pair of angular edge connector TSVs 122a, 122b (FIG. 2A) extend from circuit structure 120 through core 118' to the accessible portion 110d of the peripheral edge surface 110c (FIG. 2) of die 118. Only TSV 122a is visible in FIG. 2. FIG. 2A shows the intersection of angular edge connector TSVs 122a and 122b with accessible portion 110d of peripheral edge surface 110c.

Referring to FIGS. 3 and 3A, a die 218 has orthogonal edge connector TSV 226 (FIG. 3) comprised of a first leg 226a which extends substantially perpendicularly relative to first surface 210a and second surface 210b to intersect second leg 226b. The latter extends along second surface 210b to the accessible portion 210d of peripheral edge surface 210c. A dielectric layer 228 is applied to second surface 210b in order to insulate second leg 226b of orthogonal edge connector TSV 226. Dielectric layer 228 also serves to insulate additional second legs 227, 227a and 227b (FIG. 3A) which also extend from first leg 226a (FIG. 3) in a direction opposite from that in which second leg 226b extends.

The dielectric layer 228 may include one or more dielectric materials. The dielectric layer 228 may include, for example, dielectric oxides (e.g., silicon oxide), dielectric nitrides (e.g., silicon nitride), dielectric oxynitrides, or any combination thereof. The dielectric material may be deposited by a deposition process, for example, chemical vapor deposition (CVD) or physical vapor deposition (PVD).

Built-up layers 38 are formed in additional back-side processing which is carried out post-thinning. The layers may be built up by etching or dual damascene processing, resulting in the square cross-sectional configuration of additional second legs 227 and 277b and the rectangular cross-sectional configuration of leg 227a. Obviously, instead of or in addition to branched second legs extending along second surface 210b of die 218 one or more additional orthogonal first legs (not shown in FIG. 3 or 3A) could be utilized to connect with second leg segments.

Figure 4:
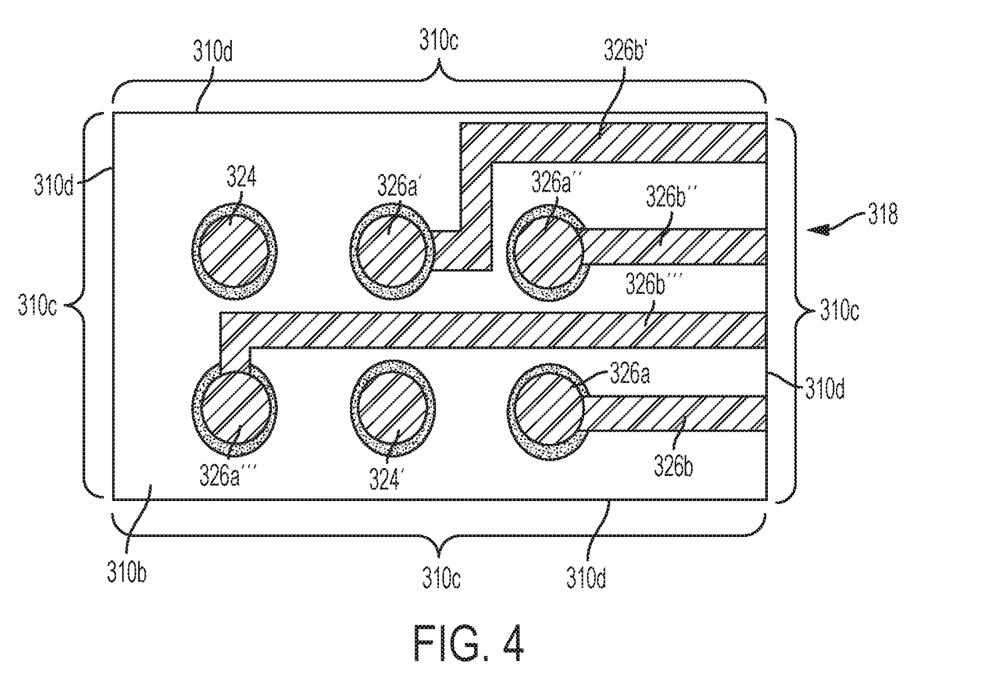
FIG. 4 is a schematic bottom plan view of a stage of fabrication of a semiconductor structure in accordance with another embodiment of the present invention.
Figure 4A:
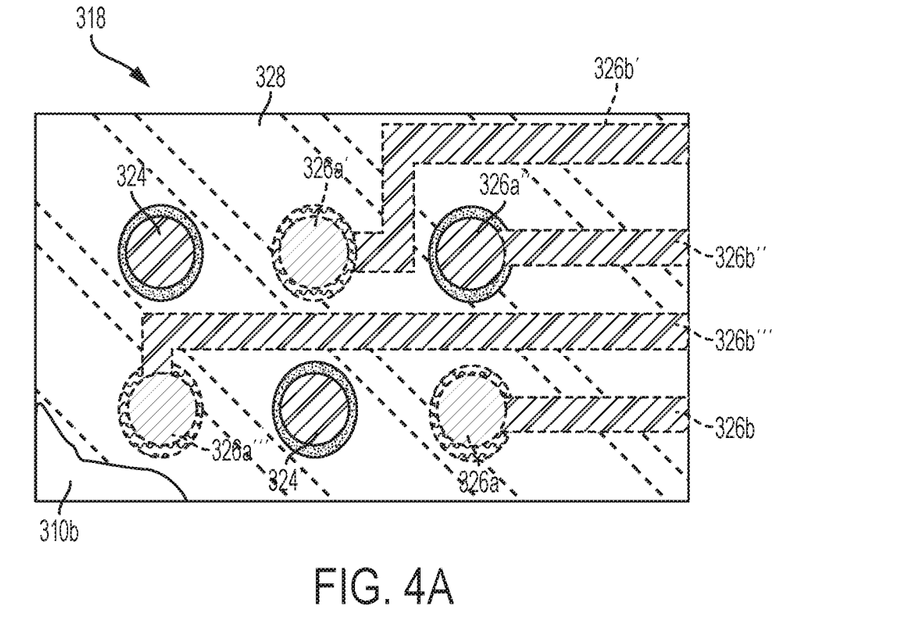
FIG. 4A is a view corresponding to FIG. 4 but showing a later stage in the fabrication of the semiconductor structure.

FIGS. 4 and 4A show the second surface 310b of a die 318 having accessible portion 310d of peripheral edge surface 310c. Peripheral edge surface 310c of course extends around the entire perimeter of die 318. A pair of bottom connector TSVs 324 and 324' extend between the first surface (not shown in FIGS. 4 and 4A) of die 318 and the second surface 310b of die 318. The first surface of die 318 corresponds to first surface 210a of die 218 (FIG. 3). Bottom connector TSVs 324 and 324' enable connection of components of circuit structures on the first surface of die 318 to second surface 310b. The first surface and circuit structure are not shown in FIGS. 4 and 4A but correspond to corresponding structures in the other embodiments, for example, first surface 10a of FIGS. 1A and 1B and circuit structure 20 of FIG. 1A.

Four orthogonal edge connector TSVs 326 are each comprised, respectively, of first legs 326a, 326a', 326a" and 326a''' which connect to respective second legs 326b, 326b', 326b" and 326r, which in turn ultimately connect to accessible portion 310d of die 318. As shown in FIG. 4A, a dielectric layer 328 is applied over second surface 310b leaving bottom connector TSVs 324, 324' and first leg 326a" uninsulated. In this way, bottom connector TSVs 324, 324' may be connected to circuit structures and first leg 326a" may effectuate both a bottom connection and, via second leg 326b", an edge connection of die 318.

Figure 5:
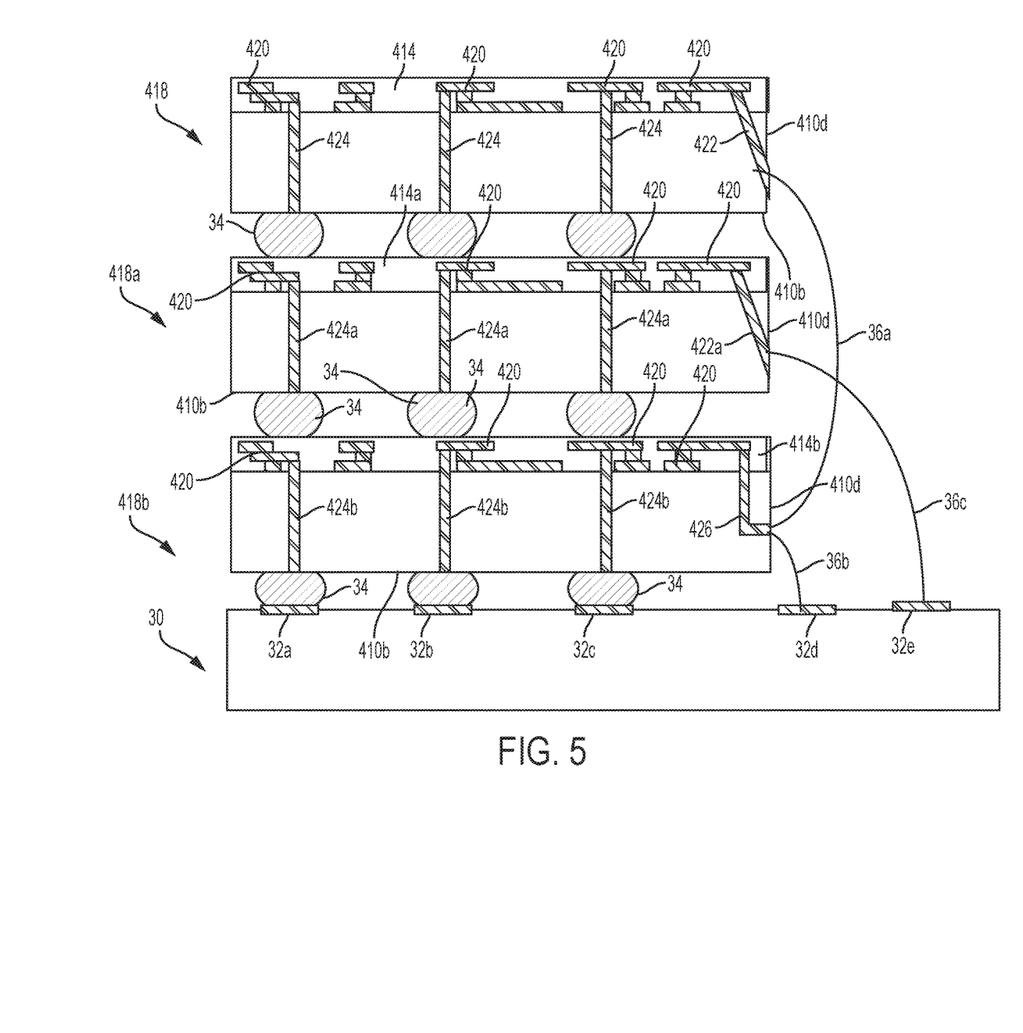
FIG. 5 is a schematic cross-sectional view in elevation of an assembly of semiconductor structures in accordance with a fifth embodiment of the present invention.

FIG. 5 shows three dies 418, 418a and 418b supported on a substrate 30 and interconnected with each other and with substrate circuit structures 32a, 32b, 32c, 32d and 32e, all supported on substrate 30. Each of dies 418, 418a and 418b comprises a respective crackstop structure 414, 414a and 414b and each has respective circuit structures each identically numbered 420. The identical numbering should not be taken to mean that each of the circuit structures is identical. While at least some of the circuit structures 420 may be identical, others may differ from each other. Dies 418, 418a and 418b each have respective accessible portions 410d and respective first surfaces (not shown in FIG. 5) and second surfaces 410b. The first surfaces correspond to first surfaces 10a, 110a, etc., in, e.g., FIG. 1A and FIG. 2

Dies 418, 418a and 418b each have three identically numbered bottom connector TSVs, respectively numbered 424, 424a and 424b. Die 418 has an angular edge connector TSV 422, die 418a has an angular edge connector TSV 422a and die 418b has an orthogonal edge connector TSV 426. Dies 418, 418a and 418b are connected in series to each other and to substrate circuit structures 32a, 32b, 32c, 32d and 32e by a plurality of solder ball connectors 34.

Connections are also made by wire bonds. Wire bond 36a connects angular edge connector TSV 422 to orthogonal edge connector TSV 426, which is in turn connected by wire bond 36b to substrate circuit structure 32d. Wire bond 36c connects angular edge connector TSV 422a to substrate circuit structure 32e. It is seen that the ability to utilize edge connector TSVs such as TSVs 422, 422a and 426 in an assembly such as that schematically illustrated in FIG. 5 provides versatility and the ability to provide additional connections in a crowded space.

Although FIG. 5 illustrates edge connector TSVs only for TSVs which are adjacent to accessible portions 410d of the peripheral edges (unnumbered in FIG. 5) of the dies, it is also feasible that edge connector TSVs need not be disposed immediately adjacent to accessible portions 410d.

Results are noted in FIG. 5 that the horizontal leg (as viewed in the drawing) of orthogonal edge connector TSV 426 is somewhat removed from surface 410b of die 418b. Normally, the horizontal leg will be formed at bottom surface 410b but in the illustrated embodiment reflects the option of building up the bottom of die 418 with dielectric or other layers so that in the finished product the horizontal leg of orthogonal edge connector TSV 426 penetrates accessible portion 410d at a distance somewhat removed from the built-up second surface 410b. In this way, a stacked array of dies 418, 418a and 418b mounted on a substrate 30 may be interconnected both via wire bonds and solder balls into a compact array of semiconductor structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a silicon-containing substrate having a first surface on which is disposed a circuit structure, a second surface, and a peripheral edge surface;
   a peripheral crackstop structure circumscribing the circuit structure and extending along a portion of the peripheral edge surface adjacent to the first surface and stopping short of the second surface, to thereby leave an accessible portion of the peripheral edge surface free of the crackstop structure; and
   one or more edge connector through-silicon conductive vias ("edge connector TSVs") connecting the circuit structure to the accessible portion of the peripheral edge surface without penetrating the crackstop structure.

2. The semiconductor structure of claim 1 wherein the one or more edge connector TSVs are angular edge connector TSVs, at least a segment of the angular edge connector TSVs extending through the substrate at an acute angle relative to the first surface.

3. The semiconductor structure of claim 2 wherein the entirety of at least one of the angular edge connector TSVs extends at an acute angle relative to the first surface.

4. The semiconductor structure of claim 1 wherein the one or more edge connector TSVs have at least a first leg and a second leg, the first leg extending perpendicularly to the first surface through the substrate to the second leg, and the second leg extending along the second surface to the accessible portion of the peripheral edge surface.

5. The semiconductor structure of claim 4 wherein the second leg is accessible at the second surface.

6. An array of interconnected semiconductor structures, at least one of which comprises the semiconductor structure of claim 1.

7. An array of interconnected semiconductor structures comprising a plurality of the semiconductor structure of claim 1.

8. The array of claim 7 mounted on a support member to provide a semiconductor assembly with respective ones of the edge connector TSVs connected to one or both of other edge connector TSVs and other elements of the assembly.

9. A semiconductor structure comprising:
   a silicon-containing substrate having a first surface on which is disposed a circuit structure circumscribed by a peripheral crackstop structure, an opposite second surface and a peripheral edge surface, the peripheral crackstop structure being disposed on the peripheral edge surface and extending from the first surface towards the second surface but stopping short of the second surface to thereby leave an accessible portion of the peripheral edge surface free of the crackstop structure;
   one or more edge connector through-silicon conductive vias ("edge connector TSVs") connecting the circuit structure to the accessible portion of the peripheral edge surface without penetrating the crackstop structure;
   wherein the one or more edge connector TSVs are selected from the group consisting of (1) angular edge connector TSVs characterized by having at least a segment thereof extending through the substrate at an acute angle relative to the first surface and extending to the accessible portion of the peripheral edge surface; and (2) orthogonal edge connector TSVs characterized by having at least a first leg and a second leg, the first leg extending substantially perpendicularly to the first surface through the substrate to the second leg, and the second leg extending along the second surface to the accessible portion of the peripheral edge surface.

10. A plurality of interconnected semiconductor structures, at least one of which comprises the semiconductor structure of claim 9.

11. A method of making a plurality of semiconductor structures, the method comprising providing a silicon wafer having a top surface having thereon a plurality of mounting areas adapted to receive respective circuit structures, an opposite bottom surface, and a plurality of peripheral crackstop structures extending about associated ones of the mounting areas and extending from the top surface towards the bottom surface but stopping short of the bottom surface, forming in the wafer a plurality of conductive through-silicon vias ("TSVs") extending from respective ones of the mounting areas, and dicing the wafer along dicing pathways to form a plurality of dies having respective opposite first and second surfaces and peripheral edge surfaces which cooperate to define a core of the die.

12. The method of claim 11 wherein the crackstop structures extend below the top surface of the wafer and stop short of the bottom surface of the wafer whereby the peripheral edge surfaces of the dies comprise accessible portions through which the core of the die is accessible without penetrating the crackstop structure, and configuring at least some of the TSVs as edge connector TSVs which extend from respective ones of the mounting areas to locations on the dicing pathways which are free of the crackstop structures, whereby when such dies are cut from the wafer the edge connector TSVs terminate at accessible portions of the peripheral edge surfaces of the dies without penetrating the crackstop structure.

13. The method of claim 12 wherein the improvement further comprises configuring at least some of the edge connector TSVs as angular edge connector TSVs, at least a segment of the angular edge connector TSVs extending through the wafer at an acute angle relative to the first and second major surfaces of the dies.

14. The method of claim 12 wherein the improvement further comprises configuring at least some of the edge connector TSVs as orthogonal edge connector TSVs having a first leg which extends to the second surface of the die perpendicularly to the first surface, and a second leg connected to the first leg, the second leg being accessible at and extending along the bottom surface of the die to the accessible portion of the peripheral edge surfaces.

15. The method of claim 14 wherein the improvement further comprises applying a dielectric to the accessible second legs of the edge connector TSVs.

16. The method of claim 12 further comprising disposing respective circuit structures on respective mounting areas and connecting the circuit structures to the edge connector TSVs.

\* \* \* \* \*